United States Patent [19]
Kellerman

[11] Patent Number: 5,178,934
[45] Date of Patent: Jan. 12, 1993

[54] THICK-FILM DEVICES HAVING DIELECTRIC LAYERS WITH EMBEDDED MICROSPHERES

[75] Inventor: David Kellerman, Littleton, Mass.

[73] Assignee: Digital Equipment Corporation, Maynard, Mass.

[21] Appl. No.: 540,847

[22] Filed: Jun. 20, 1990

Related U.S. Application Data
[62] Division of Ser. No. 372,059, Jun. 27, 1989.

[51] Int. Cl.$^5$ ............................................. B32B 3/00
[52] U.S. Cl. .................................. 428/209; 428/210; 428/313.3; 428/313.9; 428/318.6
[58] Field of Search ............... 428/209, 210, 313.3, 428/313.9, 318.6

[56] References Cited

U.S. PATENT DOCUMENTS
| | | | |
|---|---|---|---|
| 4,798,758 | 1/1989 | Nagano et al. | 428/318.6 |
| 4,833,015 | 5/1989 | Furuuchi et al. | 428/318.6 |
| 4,867,935 | 9/1989 | Morrison, Jr. | 264/61 |
| 4,954,480 | 9/1990 | Imanaka et al. | 428/209 |

Primary Examiner—William J. Van Balen
Attorney, Agent, or Firm—Nutter, McClennen & Fish

[57] ABSTRACT

To produce a layer in a multi-layer circuit structure, a "green ceramic tape" (16) comprising a sheet of particles of ceramic, glass ceramic, or a glass/ceramic composite in an organic binder is applied to a ceramic substrate (12) on which conductive paths (14) have been deposited. A slurry of hollow microspheres (20) is then deposited onto the green ceramic tape (16), and pressure is applied to drive the spheres into the tape. A further tape layer (22) is then applied, and the resultant structure is fired.

14 Claims, 1 Drawing Sheet

THICK-FILM DEVICES HAVING DIELECTRIC LAYERS WITH EMBEDDED MICROSPHERES

This is a divisional of copending U.S. Pat. No. application Ser. No. 372,059, filed on Jun. 27, 1989, by David Kellerman for a METHOD OF MANUFACTURING THICK-FILM DEVICES.

BACKGROUND OF THE INVENTION

The present invention is directed to the fabrication of thick-film and multilayer ceramic devices. It particularly concerns the formation of the dielectric layers of such devices.

The thick-film process is used to provide packages for individual integrated circuits as well as to interconnect a plurality of such circuits. In accordance with the thick-film process, conductive paths for providing the connections among the various terminals of the integrated circuits are deposited on substrate materials, a dielectric layer is applied over the conductive paths, and further conductive paths are then deposited over the dielectric material so as to form a three-dimensional connection structure.

There are a number of reasons why it is desirable from a mechanical and heat-transfer point of view to employ ceramic material, as opposed to organic resins, as the dielectric. However, ceramic materials are less desirable than organic ones in one respect, namely, their relatively high dielectric constant. The high dielectric constant results in a high capacitance between the conductive paths at various levels, and it limits the maximum speed of the circuitry that can be embodied in the thick-film device.

To reduce this drawback but still obtain the advantages of ceramic dielectrics, U.S. Pat. No. 4,781,968 to Kellerman proposed to embed hollow glass microspheres in the ceramic material. The presence of the microspheres reduces the effective dielectric constant of the resultant dielectric layer and thus increases maximum circuit speed. I hereby incorporate that patent by reference.

In the method described in that patent, the microspheres are mixed with a composition comprising ceramic or a glass/ceramic composite matrix material disposed in a conventional thick-film organic carrier vehicle, and the mixture is deposited over conductive paths formed on a substrate. The resultant structure is then fired.

SUMMARY OF THE INVENTION

The dielectric layer fabricated according to the present invention is similarly a combination of microspheres and ceramic material. However, the ceramic material and the microspheres are applied separately in the present invention. Specifically, the ceramic material can be applied as a "green" (unfired) ceramic tape, which comprises ceramic and/or glassy powders suspended in an organic binder and dried into a pliable sheet. The green ceramic tape is punched into the proper shape and then applied to the ceramic substrate over the metallization layer, i.e., over the conductive paths. The tape may be held on the substrate by an appropriate fixture and laminated in place with the application of heat and pressure. The microspheres are then applied under pressure so that they become embedded in the green-tape structure. As a result, the "tape-transfer" method can be employed with microspheres. A percentage of microspheres can be achieved that is higher than the percentage possible if, say, the spheres were initially cast into the tape before the application of the tape to the substrate.

BRIEF DESCRIPTION OF THE DRAWINGS

These and further features and advantages of the present invention are described in connection with the accompanying drawings, in which.

DETAILED DESCRIPTION OF ILLUSTRATIVE EMBODIMENTS

Figure 1:
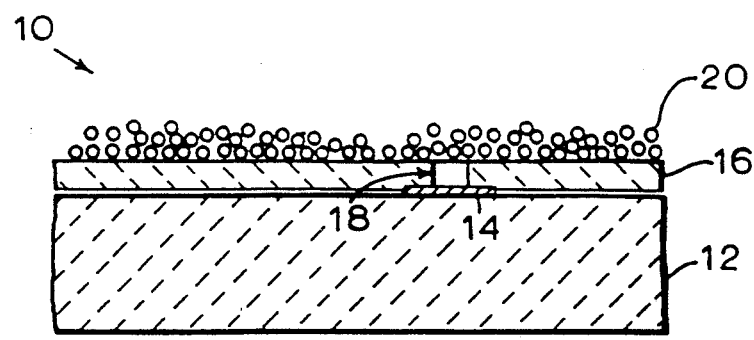
FIG. 1 is a cross-sectional representation of a thick-film tape-transfer structure immediately after the application of microspheres.

FIG. 1 depicts a thick-film tape-transfer structure 10 including a ceramic substrate 12 of the type typically employed in a thick-film or tape-transfer process for fabricating large-scale integrated circuits. The substrate 12 is composed of an appropriate ceramic material, such as alumina. Applied to the ceramic substrate is a metallization layer, of which FIG. 1 depicts one path 14. The path is applied as a thick-film "ink," i.e., a paste of conductive particles suspended in a high-viscosity vehicle. This ink is silk-screened onto the ceramic substrate in the desired pattern, and the resultant structure is fired so that the conductive particles are sintered into a continuous path.

In accordance with the "tape-transfer" method, dielectric material is then applied in the form of a "green" ceramic tape 16. The green ceramic tape is typically made by first depositing a slurry on a tape of polyethylene terephthalate. The slurry includes an organic plasticizer, such as polyvinyl chloride, in which ceramic and/or glassy powder has been suspended. The material may be a "glass Ceramic" (i.e., vitrified glass), a glass/ceramic composite (i.e., a suspension of ceramic material such as alumina in a matrix of non-crystalline glass), or a ceramic. The slurry is then drawn under a doctor blade to achieve a predetermined thickness of, for instance, 100 microns, and the resulting structure is dried into a tape that can be handled, punched, and applied to an intermediate structure in the thick-film process. This unfired material is commonly called "green ceramic tape". I will use the term here to refer to any such tape.

In adapting the conventional tape-transfer approach to the method described in the previously mentioned Kellerman patent, I have not included the microspheres in the slurry used to cast the green ceramic tape. Instead, I apply the green ceramic tape in the conventional form, i.e., without microspheres.

The green ceramic tape 16 may be punched with "vias" 18, which are holes by which communication may be had between conductive paths in different layers. The tape may be held to the substrate by an appropriate fixture, and it may be laminated by the application of, say, 500 lbs./in$^2$ (3.4×10$^6$ Pa.) of pressure at an elevated temperature (70° C.) for two minutes so that it adheres to the previously fired ceramic substrate 12. An isostatic laminater can be used for this purpose.

Regardless of the manner in which the tape is held in place, I then apply hollow microspheres 20 on top of the tape. One way of providing the spheres is to screen them on as a slurry. For instance, the slurry may be prepared as a mixture of hollow spheres of alumina, silica, or glass of the type available, for instance, from Emerson and Cumming, Inc., of Canton, Massachusetts, under the trademark ECCOSPHERES. These are available in average sizes of 12 to 40 microns and average wall sizes of 0.5 to 2.0 microns. So as not to exceed the intended layer thickness, it is desirable first to screen the microspheres to about 400 mesh (U.S. standard sieve series) to eliminate the larger spheres before combining the spheres with a vehicle to produce a slurry. The vehicle may be, for instance, the organic thinner ordinarily sold with thick-film conductive inks. A good ratio is five parts by weight of the microspheres to thirteen parts by weight of vehicle, the two components being mixed by jar rolling in a ball mill without milling materials, for instance. This slurry of microspheres 20 is then screen printed through a stainless-steel screen or metal mask onto the surface as shown in FIG. 1. The mask may be arranged to leave the via 18 open.

Figure 2:
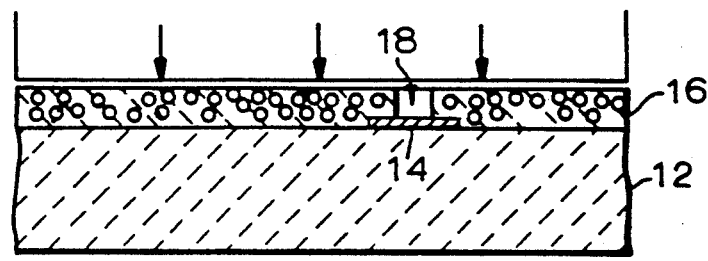
FIG. 2 is a diagrammatic representation of the step in which the microspheres are pressed into the green tape.

After any necessary drying occurs, pressure is applied, as is suggested by FIG. 2, to press the microspheres 20 into the green ceramic tape 16. If the tape has not already been laminated to the substrate at this point, the application of pressure has the further purpose of performing the lamination, that is, of causing the tape to adhere to the substrate. For this purpose, as was stated before, a pressure of about 500 lbs./in.$^2$ ($3.4 \times 10^6$ Pa.), preferably at an elevated temperature, is desirable. Such pressure does not adversely affect the microspheres, which are resistant to pressures in excess of 1,500 lbs./in.$^2$ ($1.0 \times 10^7$ Pa.) for 30-second time intervals.

Figure 3:
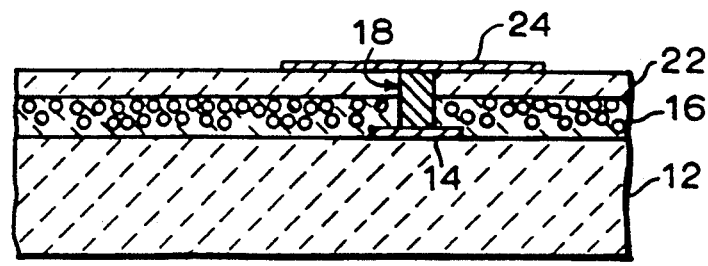
FIG. 3 depicts the structure after a further layer of green ceramic tape and a further metallization layer have been applied.

In order to increase the microsphere content, it may be desirable to repeat the step of applying microspheres and applying pressure. In any event, a second layer of tape 22 is then laminated to the relatively rough surface of the resultant structure so as to yield a smoother surface, as FIG. 3 indicates. In the alternative, a layer of thick-film dielectric may be screened onto the surface instead of being applied as a tape. The entire structure is then dried, if necessary, and fired, typically at a temperature in the range of 850° C.-900° C.

As is stated above, vias 18 are left to provide for electrical communication between layers. An alternative method is not to provide the vias by tape punching and screening but rather to lay the tape and microsphere layers without the vias and then "drill" the vias in the fired structure by means of, for instance, laser light. The vias are then filled with conductive material in a conventional manner to provide the inter-layer interconnections. Subsequent layers are then laid down, beginning with a conductive path 24, which communicates with conductive path 14 by way of the via 18.

Although the foregoing discussion describes one process for implementing the teachings of the present invention, others clearly are possible. For instance, it may be desirable to fire the structure immediately after pressing the microspheres, i.e., before applying the second tape layer, and then firing again after the second tape layer has been applied. It may also be appropriate in some circumstances to apply the microsphere slurry before applying any green ceramic tape. This would eliminate the need for a second application of green ceramic tape. However, I prefer to apply the tape layer first, thereby avoiding any possible adhesion problems and providing a "cushion" for the spheres to be pressed into. Finally, although I prefer to apply the microspheres in the form of a slurry, there is no reason in principle why they could not be applied dry, perhaps from a cavity placed in a isostatic laminater.

It is thus apparent that the teachings of the present invention can be employed in many variations that retain the advantages of the green ceramic tape approach while achieving the low dielectric constant that is afforded through the use of microspheres. Therefore, it is intended that all matter contained in the above description or depicted in the accompanying drawings be interpreted as illustrative and not limiting in nature.

I claim:

1. A multilayer ceramic device fabricated by a method comprising the steps of:
   A. providing a ceramic substrate;
   B. applying a metal layer to the substrate;
   C. separately applying to the ceramic substrate over the metal layer (i) a green ceramic tape and (ii) a layer of hollow microspheres; and
   D. firing the resultant structure.

2. The ceramic device defined in claim 1 wherein the step of separately applying the green ceramic tape and microspheres comprises applying the green ceramic tape first and then applying the layer of microspheres.

3. The ceramic device defined in claim 2 wherein the method by which it is fabricated further includes the step of applying further green ceramic tape after applying the layer of microspheres.

4. The ceramic device defined in claim 2 wherein the method by which it is fabricated further includes the step of laminating the green ceramic tape to the substrate under elevated pressure before applying the layer of microspheres.

5. The ceramic device defined in claim 4 wherein the method by which it is fabricated further includes the step of pressing the microspheres into the green ceramic tape before the firing step.

6. The ceramic device defined in claim 2 wherein the method by which it is fabricated further includes the step of pressing the microspheres into the green ceramic tape before the firing step.

7. The ceramic device defined in claim 2 wherein the method by which it is fabricated further includes the step of applying elevated pressure to the layer of microspheres and green ceramic tape so as simultaneously to laminate the green ceramic tape to the substrate and press the microspheres into the green ceramic tape without having laminated the green ceramic tape to the substrate before applying the layer of microspheres.

8. The ceramic device defined in claim 2 wherein the step of applying the layer of microspheres comprises depositing the microspheres in a slurry of hollow microspheres suspended in an organic vehicle.

9. The ceramic device defined in claim 2 wherein the step of applying the hollow microspheres comprises applying the hollow microspheres alone without a vehicle.

10. The ceramic device defined in claim 2 wherein the method by which it is fabricated further includes the step of screening a dielectric layer onto the structure after applying the layer of microspheres.

11. The ceramic device defined in claim 1 wherein the step of applying the layer of microspheres comprises depositing the microspheres in a slurry of hollow microspheres suspended in an organic vehicle.

12. The ceramic device defined in claim 1 wherein the step of applying the hollow microspheres comprises applying the hollow microspheres alone without a vehicle.

13. A multilayer ceramic device fabricated by a method comprising the steps of:
   A. providing a ceramic substrate;
   B. applying a metal layer to the substrate;
   C. separately applying to the ceramic substrate over the metal layer (i) a layer of a mixture of an organic plasticizer and particles of a glass ceramic, a glass/ceramic composite, or a ceramic and (ii) a layer of hollow microspheres; and
   D. firing the resultant structure.

14. The ceramic device defined in claim 13 wherein the step of separately applying the mixture and hollow microspheres comprises applying the mixture first and then applying the layer of microspheres.

* * * * *